United States Patent
Seo et al.

(10) Patent No.: US 11,526,739 B2
(45) Date of Patent: Dec. 13, 2022

(54) NONVOLATILE MEMORY DEVICE PERFORMING A MULTIPLICATION AND ACCUMULATION OPERATION

(71) Applicants: SK hynix Inc., Icheon (KR); Korea Advanced Institute of Science and Technology (KAIST), Daejeon (KR)

(72) Inventors: Jin-O Seo, Uiwang (KR); Hyuk-Jin Lee, Suwon (KR); SeongHwan Cho, Daejeon (KR)

(73) Assignees: SK HYNIX INC., Icheon (KR); KOREA ADVANCED INSTITUTE OF SCIENCE AND TECHNOLOGY (KAIST), Daejeon (KR)

( * ) Notice: Subject to any disclaimer, the term of this patent is extended or adjusted under 35 U.S.C. 154(b) by 342 days.

(21) Appl. No.: 16/838,916

(22) Filed: Apr. 2, 2020

(65) Prior Publication Data

US 2021/0073621 A1 Mar. 11, 2021

(30) Foreign Application Priority Data

Sep. 5, 2019 (KR) .................. 10-2019-0109899
Mar. 27, 2020 (KR) .................. 10-2020-0037872

(51) Int. Cl.
| | |
|---|---|
| *G11C 7/00* | (2006.01) |
| *G06N 3/063* | (2006.01) |
| *G11C 16/04* | (2006.01) |
| *G06N 3/04* | (2006.01) |
| *G11C 16/08* | (2006.01) |
| *G06F 7/523* | (2006.01) |
| *G11C 16/24* | (2006.01) |

(52) U.S. Cl.
CPC ............. *G06N 3/063* (2013.01); *G06F 7/523* (2013.01); *G06N 3/04* (2013.01); *G11C 16/0483* (2013.01); *G11C 16/08* (2013.01); *G11C 16/24* (2013.01)

(58) Field of Classification Search
CPC ....... G11C 7/1051; G11C 7/22; G11C 7/1072; G11C 7/1006; G11C 7/1066
USPC ........................................ 365/189.15, 189.14
See application file for complete search history.

(56) References Cited

U.S. PATENT DOCUMENTS

| | | | |
|---|---|---|---|
| 9,430,735 B1 | 8/2016 | Vali et al. | |
| 2012/0086487 A1* | 4/2012 | Kishishita | ............. G06F 1/3296 327/158 |
| 2017/0271023 A1* | 9/2017 | Maejima | ............ G11C 16/3436 |

FOREIGN PATENT DOCUMENTS

| | | |
|---|---|---|
| CN | 108446097 A | 8/2018 |
| KR | 10-2010-0034614 A | 4/2010 |

* cited by examiner

*Primary Examiner* — Son T Dinh (57) ABSTRACT

A nonvolatile memory device includes a memory cell array and an computation output circuit. The memory cell array includes a plurality of nonvolatile memory elements configured to store a plurality of weights respectively and a plurality of bit lines coupled to the plurality of nonvolatile memory elements according to a plurality of input signals. The computation output circuit is configured to generate a computation signal from voltages induced at the plurality of bit lines according to the plurality of input signals.

12 Claims, 8 Drawing Sheets

NONVOLATILE MEMORY DEVICE PERFORMING A MULTIPLICATION AND ACCUMULATION OPERATION

CROSS-REFERENCE TO RELATED APPLICATIONS

The present application claims priority under 35 U.S.C. § 119(a) to Korean Patent Application No. 10-2019-0109899, filed on Sep. 5, 2019 and Korean Patent Application No. 10-2020-0037872, filed on Mar. 27, 2020, which are incorporated herein by reference in its entirety.

BACKGROUND

1. Technical Field

Various embodiments relate to a nonvolatile memory device performing a multiplication and accumulation (MAC) operation.

2. Related Art

Neural networks are widely used in artificial intelligence applications, such as image recognition and technologies used in autonomous vehicles.

In an example, a neural network includes an input layer, an output layer, and one or more inner layers between the input layer and the output layer.

Each of the output layer, the input layer, and the inner layers includes one or more neurons. Neurons contained in adjacent layers are connected in various ways through synapses. For example, synapses point from neurons in a given layer to neurons in a next layer. Alternately or additionally, synapses point to neurons in a given layer from neurons in a previous layer.

Each of the neurons stores a value. The values of the neurons included in the input layer are determined according to an input signal, for example, an image to be recognized. The values of the neurons contained in the inner and output layers are based on the neurons and synapses contained in corresponding previous layers. For example, the values of the neurons in each of the inner layers are based on the values of the neurons in a preceding layer in the neural network.

Each of the synapses has a weight. The weight of each of the synapses is based on a training operation of the neural network.

After the neural network is trained, the neural network can be used to perform an inference operation. In the inference operation, the values of the neurons in the input layer are set based on an input, and the values of the neurons in the next layers (e.g., the inner layers and the output layer) are set based on the values of the neurons in the input layer and the trained synapses connecting the layers. The values of the neurons in the output layer represent a result of the inference operation.

For example, in an inference operation, in which image recognition is performed by the neural network after the neural network has been trained, the values of the neurons in the input layer are set based on an input image, a plurality of operations are performed at the inner layers based on the values of the neurons in the input layer, and a result of the image recognition is output at the output layer from the inner layers.

In such an inference operation, a large number of MAC operations must be performed by all neurons in the convolutional neural network. As a result, a semiconductor device capable of efficiently performing a large number of MAC operations is desirable.

SUMMARY

In accordance with an embodiment of the present disclosure, a nonvolatile memory device may include a memory cell array and a computation output circuit. The memory cell array may include a plurality of nonvolatile memory elements configured to store a plurality of weights respectively and a plurality of bit lines coupled to the plurality of nonvolatile memory elements according to a plurality of input signals. The computation output circuit may be configured to generate a computation signal from voltages induced at the plurality of bit lines according to the plurality of input signals.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments that include various features, and explain various principles and beneficial aspects of those embodiments.

DETAILED DESCRIPTION

Various embodiments will be described below with reference to the accompanying figures. Embodiments are provided for illustrative purposes and other embodiments that are not explicitly illustrated or described are possible. Further, modifications can be made to embodiments of the present disclosure that will be described below in detail.

In the following disclosure, a nonvolatile memory device is disclosed using a flash memory device as an example, but the type of the nonvolatile memory device is not necessarily limited to the flash memory device.

Figure 1:
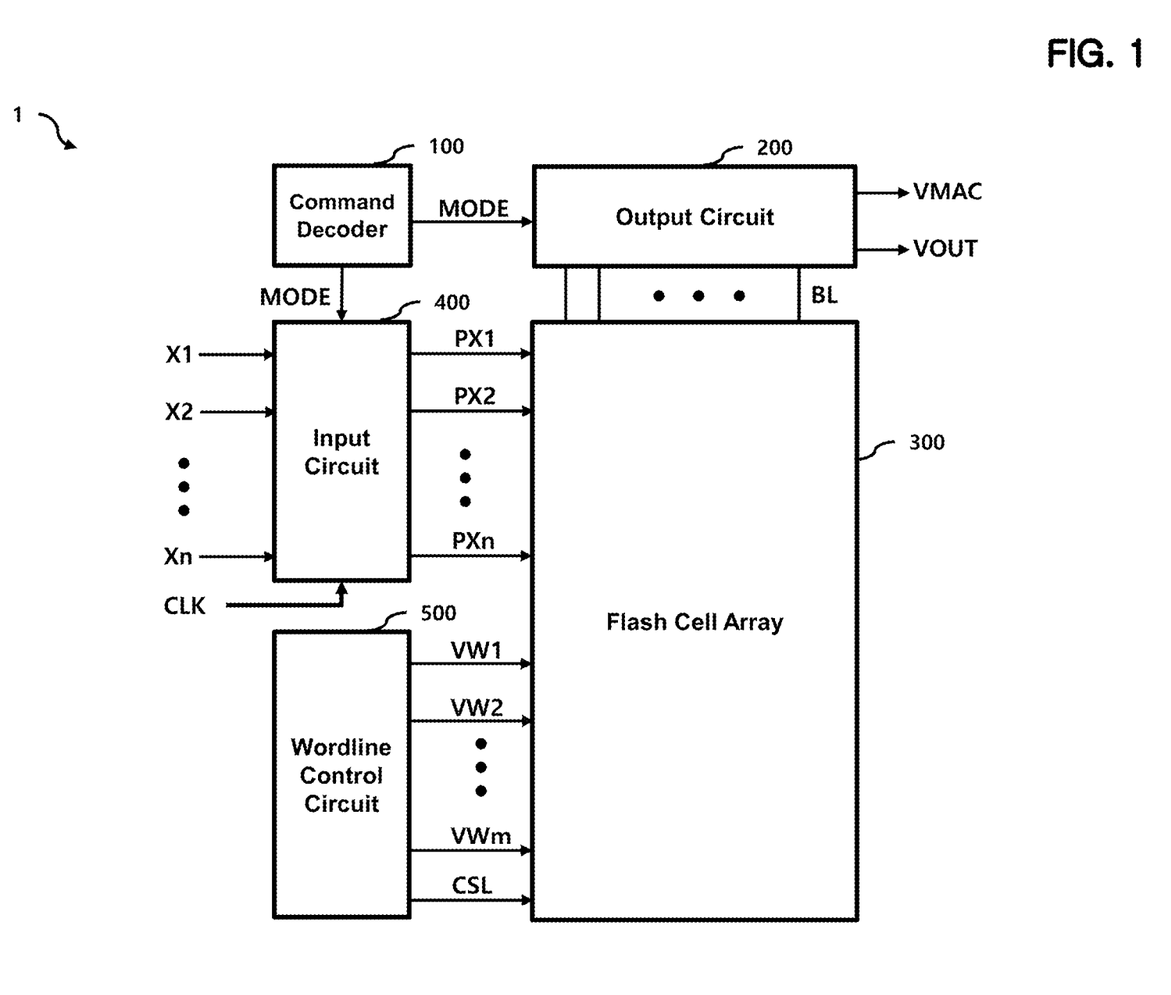
FIG. 1 illustrates a flash memory device according to an embodiment of the present disclosure.

FIG. 1 illustrates a flash memory device 1 according to an embodiment of the present disclosure.

The flash memory device 1 according to the present disclosure includes a command decoder 100, an output circuit 200, a flash cell array 300, an input circuit 400, and a word line control circuit 500.

The flash cell array 300 may be referred to as a memory cell array.

The command decoder 100 controls operations including a read operation, a program operation, and an erase operation like a command decoder included in a conventional flash memory device.

In the present embodiment, the command decoder 100 additionally performs a control operation necessary for a computation operation.

The flash memory device according to the present embodiment has a memory operation mode and a computation operation mode.

In the memory operation mode, operations of a general flash memory device may be performed. In the computation operation mode, the MAC operation may be performed.

The command decoder 100 may output a mode signal MODE to distinguish the memory operation mode from the computation operation mode.

For example, the mode signal MODE may have a low level that corresponds to a logic value "0" in the memory operation mode and the mode signal MODE may have a high level that corresponds to a logic value "1" in the computation operation mode.

The output circuit 200 is coupled to a bit line BL of the flash cell array 300 to output a data signal VOUT in the memory operation mode and to output a computation signal VMAC in the computation operation mode. In an embodiment, the output circuit 200 outputs a respective data signal VOUT for each of a plurality of bit lines BL, but only outputs one computation signal VMAC for the plurality of bit lines BL.

Figure 2:
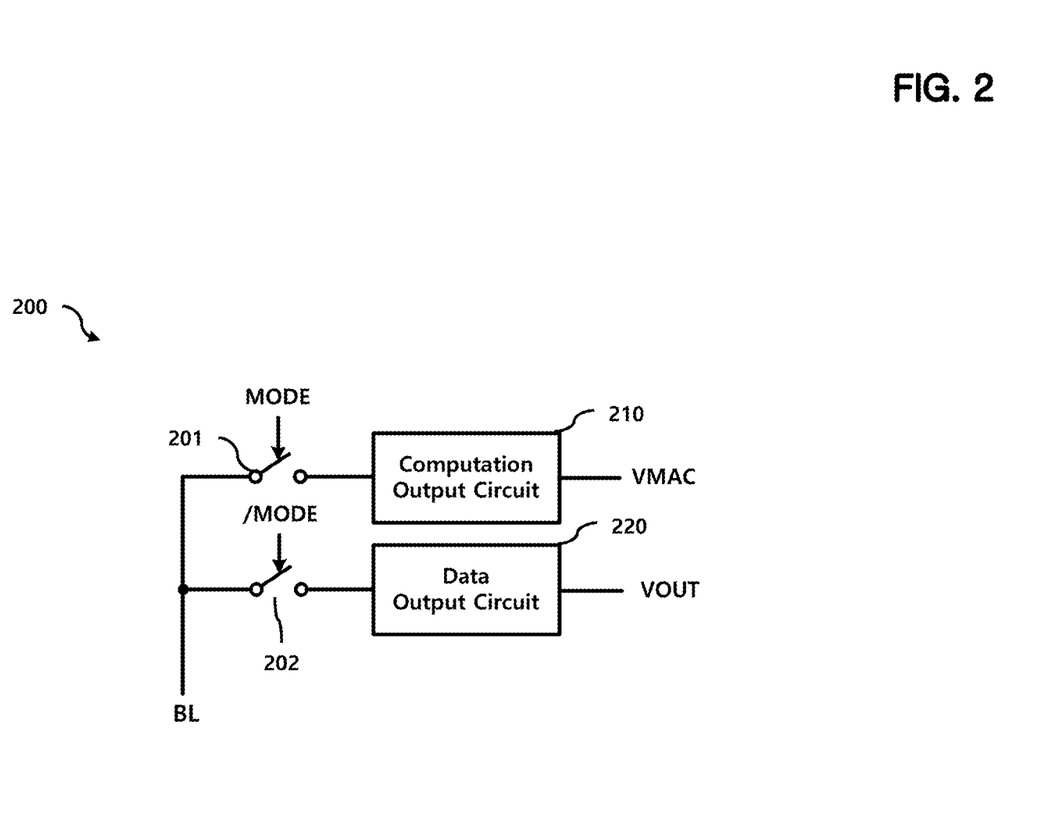
FIG. 2 illustrates an output circuit according to an embodiment of the present disclosure.

FIG. 2 is a block diagram illustrating an output circuit 200 according to an embodiment of the present disclosure.

The output circuit 200 includes a first switch 201, a second switch 202, an computation output circuit 210, and a data output circuit 220.

In this embodiment, the first switch 201 is turned on when the mode signal MODE is at the high level, and the second switch 202 is turned on when the mode signal MODE is at the low level.

The computation output circuit 210 outputs the computation signal VMAC according to a signal output from the bit line BL.

The data output circuit 220 outputs the data signal VOUT according to a signal output from the bit line BL.

Since the configuration and operation of the data output circuit 220 are substantially the same as in the conventional flash memory device, a detailed description thereof will be omitted.

The configuration and operation of the computation output circuit 210 together with the flash cell array 300 will be described in detail with reference to FIG. 3.

Referring back to FIG. 1, the input circuit 400 provides the input signals $X_1, X_2, \ldots, X_n$ to the flash cell array 300 according to the mode signal MODE.

In the memory operation mode, the input signals $X_1, X_2, \ldots, X_n$ are provided to the flash cell array 300 as it is to control the bit line selection switch.

In the memory operation mode, each of the input signals $X_1, X_2, \ldots, X_n$ may be used as a 1-bit bit line selection signal.

In the computation operation mode, the input signals $X_1, X_2, \ldots, X_n$ are converted into pulse input signals $PX_1, PX_2, \ldots, PX_n$.

In the computation operation mode, each of the input signals $X_1, X_2, \ldots, X_n$ may be provided as a multi-bit signal.

In this embodiment, the pulse input signals $PX_1, PX_2, \ldots, PX_n$ are pulse signals each having a width corresponding to a value of a corresponding one of the input signals $X_1, X_2, \ldots, X_n$.

Figure 5:
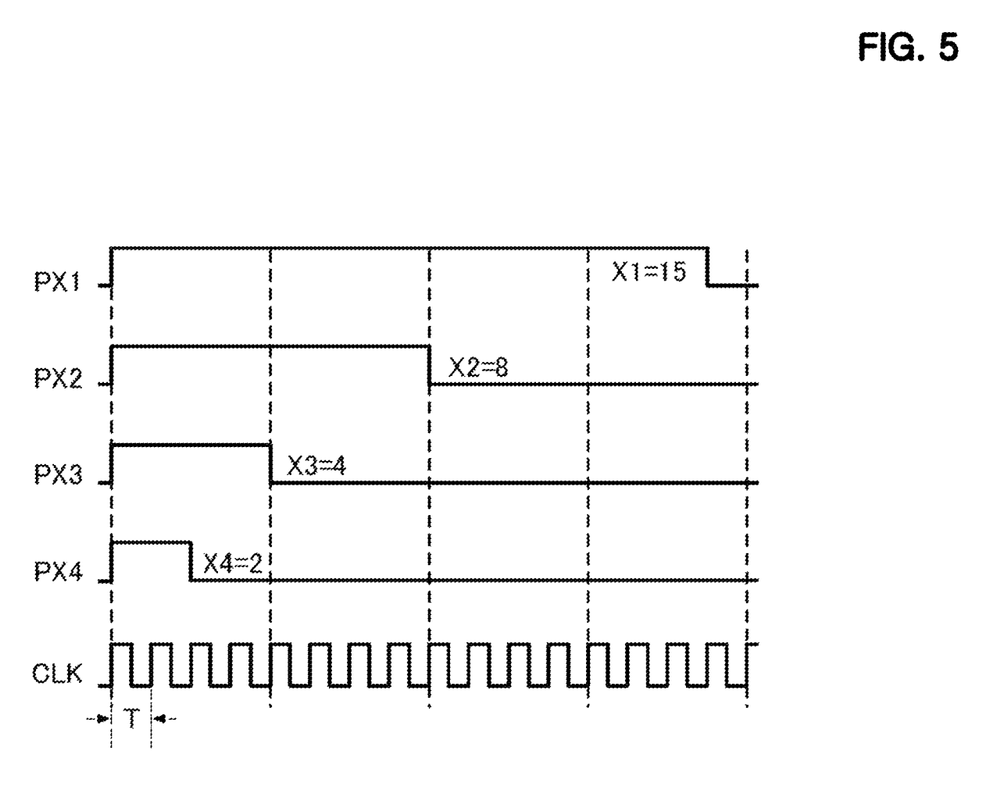
FIG. 5 illustrates an operation of an input circuit according to an embodiment of the present disclosure.

FIG. 5 is a timing diagram illustrating an operation of an input circuit 400 in a computation operation according to an embodiment of the present disclosure.

In FIG. 5, $X_1$ is "1111" (i.e., 15), $X_2$ is "1000" (i.e., 8), $X_3$ is "0100" (i.e., 4), and $X_4$ is "0010" (i.e., 2).

When the period of the clock signal CLK is T, $PX_1$ is a pulse having a width of 15 T, $PX_2$ is a pulse having a width of 8 T, $PX_3$ is a pulse having a width of 4 T, and $PX_4$ is a pulse having a width of 2 T.

Referring back to FIG. 1, the word line control circuit 500 provides a plurality of word line voltages $VW_1, VW_2, \ldots, VW_n$ to the flash cell array 300.

The word line control circuit 500 may further provide a source line selection signal CSL.

The configuration of the word line control circuit 500 is substantially the same in the conventional flash memory device.

For example, in a read operation, a plurality of word line voltages have levels of a read voltage VRead or a pass voltage VPass, respectively.

In the computation operation mode, the word line control circuit 500 may control a read operation, a program operation, and an erase operation, wherein the operation of the word line control circuit 500 is substantially the same in the memory operation mode.

Accordingly, a detailed configuration of the word line control circuit 500 is not disclosed.

Figure 3:
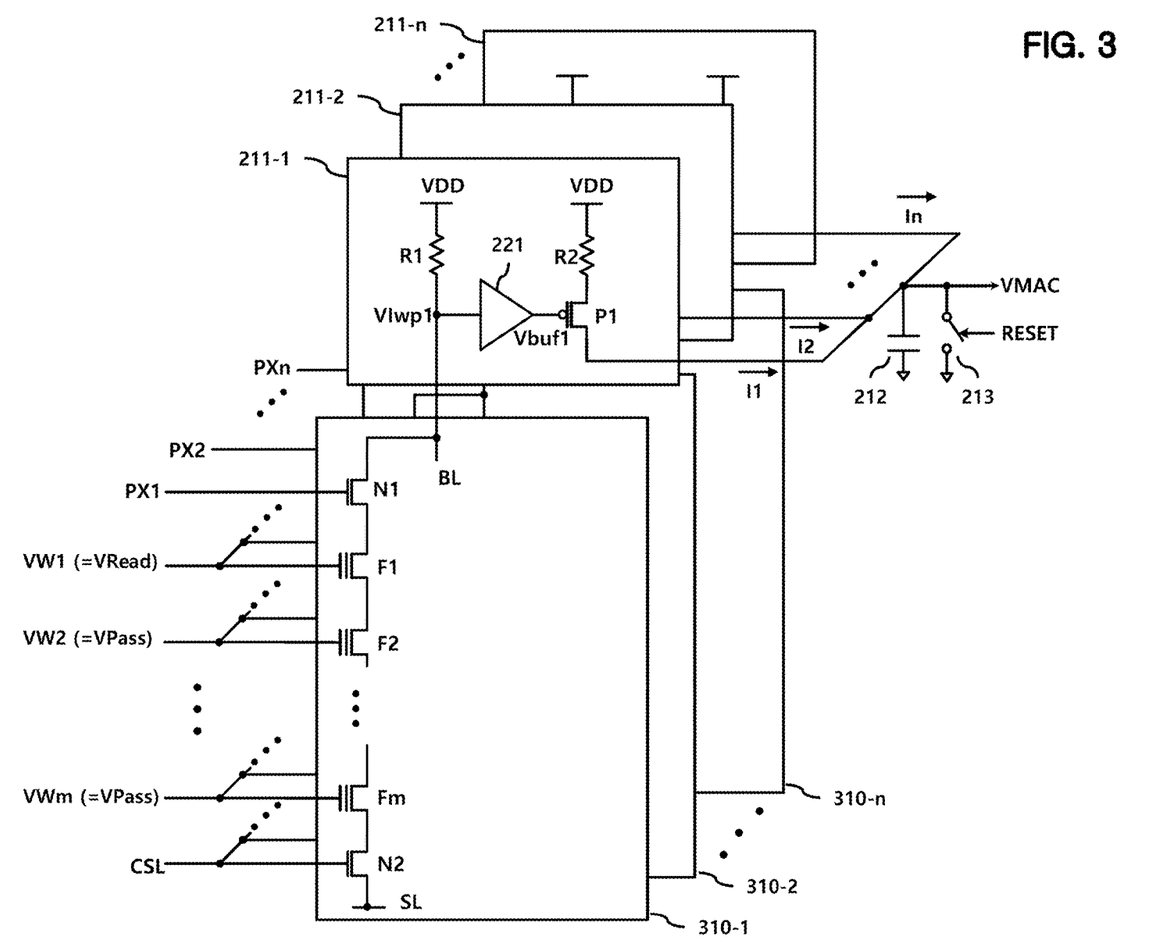
FIG. 3 illustrates a flash cell array and an output circuit according to an embodiment of the present disclosure.

FIG. 3 is a circuit diagram illustrating the flash cell array 300 and the output circuit 200 in a computation operation mode according to an embodiment of the present disclosure.

In the computation operation mode, the first switch 201 of FIG. 2 is turned on and the second switch 202 is turned off.

Accordingly, the first switch 201, the second switch 202, and the data output circuit 220 are not illustrated in FIG. 3.

The flash cell array 300 includes a plurality of NAND strings 310-1, 310-2, . . . , 310-n.

The NAND string 310-1 is coupled between the corresponding bit line BL and the source line SL and includes a plurality of flash cells F1, F2, . . . , Fm connected in series.

Hereinafter, the NAND string may be referred to as a cell string and the flash cell may be referred to as a memory cell or a memory cell element.

The NAND string 310-1 includes a bit line selection switch N1 coupling the flash cell F1 to the bit line BL and a source line selection switch N2 coupling the flash cell Fm to the source line SL.

In this embodiment, the bit line selection switch N1 and the source line selection switch N2 are NMOS transistors.

The plurality of flash cells F1, F2, . . . , Fm may be floating gate flash cells or charge trap flash cells.

Each flash cell stores a respective weight by a program operation in the flash memory device 1.

In the illustrated embodiment, each flash cell stores a one-bit weight. In another embodiment, each flash cell may store a multi-bit weight and an embodiment where each flash cell stores a 2-bit weight will be described below.

Figure 4:
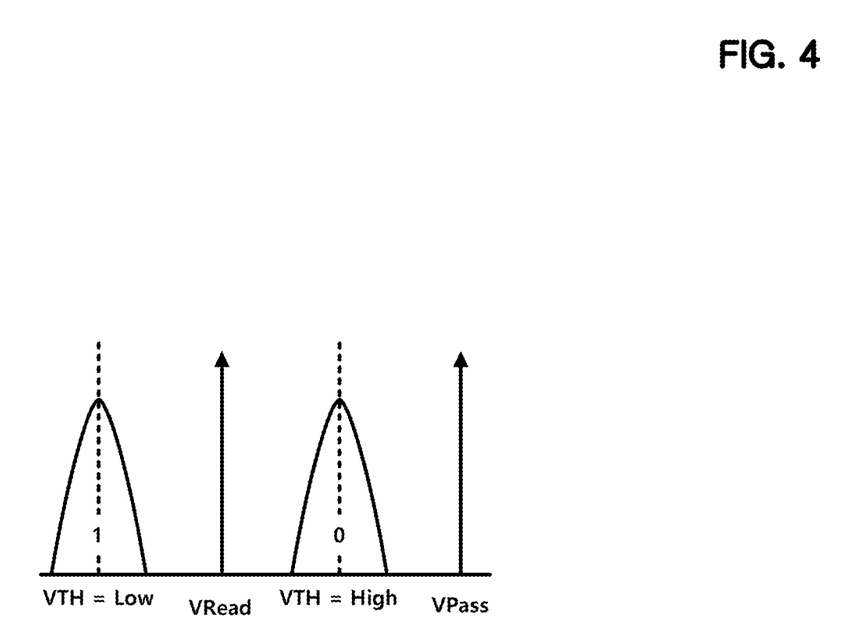
FIG. 4 illustrates an operation of a flash memory device according to an embodiment of the present disclosure.

FIG. 4 is a diagram illustrating an operation of a flash cell.

The flash cell has a low threshold voltage or a high threshold voltage depending on whether charge is injected into the floating gate (in floating gate flash cells) or the charge trap region (in charge trap flash cells).

In the present embodiment, when the threshold voltage is low, the weight corresponds to a logic value "1", and when the threshold voltage is high, the weight corresponds to a logic value "0".

In this case, when the read voltage VRead having a voltage between the low threshold voltage and the high threshold voltage is applied to the gate of the flash cell, the drain-source voltage of the flash cell varies according to the threshold voltage.

For example, when the threshold voltage is programmed to be low, applying a read voltage to the flash cell results in a low resistance state of the flash cell, resulting in a low drain-source voltage.

Conversely, when the threshold voltage is programmed to be high, applying a read voltage to the flash cell results in a high resistance state of the flash cell, resulting in a high drain-source voltage.

The pass voltage VPass is higher than the high threshold voltage so that the flash cell to which the pass voltage is applied is always in a low resistance state.

In the present embodiment, a read voltage VRead is applied to one of the flash cells F1, F2, . . . , Fm, and a pass voltage VPass is applied to the other flash cells.

In the present embodiment, since a single bit weight is stored in each flash cell, the same read voltage VRead is applied to the plurality of NAND strings 310-1, 310-2, . . . , 310-$n$ in FIG. 3.

When the flash cell stores multi-bit weight, different levels of read voltages may be provided for each NAND string, which will be described in detail with reference FIGS. 7A to 7C and FIGS. 8A to 8C.

In the present embodiment, the bit line selection switch N1 is controlled on and off by the pulse input signal $PX_1$ and the source line selection switch N2 is controlled on and off by the source line selection signal CSL.

The source line selection signal CSL may be turned on when the NAND string 310-1 is selected.

In the present embodiment, the source line selection signal CSL may be provided by the word line control circuit 500, but the configuration for providing the source line selection signal CSL may be variously changed.

The bit line selection switch N1 is turned on in the period where the pulse input signal $PX_1$ is at a high level to couple the bit line BL to the plurality of flash cells F1, F2, . . . , Fm.

When the bit line selection switch N1 is turned on, the bit line voltage VIwp1 is determined according to the weight programmed in the flash cell F1 to which the read voltage VRead is applied.

The computation output circuit 200 includes a plurality of multiplication output circuits 211-1, 211-2, . . . , 211-$n$ corresponding to the plurality of NAND strings 310-1, 310-2, . . . , 310-$n$.

Each of a plurality of multiplication output circuits outputs current corresponding to product of a corresponding pulse input signal and weight programmed in the flash cell.

For example, the multiplication output circuit 211-1 outputs multiplication current I1 having an integral over time corresponding to the product of the pulse input signal $PX_1$ and the weight $W_1$ programmed in the flash cell F1. For example, in the illustrated embodiment, the multiplication output circuit 211-1 outputs is multiplication current I1 having a current determined by the weight $W_1$ programmed in the flash cell F1 during a period when the pulse input signal $PX_1$ has a high value, and outputs substantially no current during the a period when the pulse input signal $PX_1$ has a low value.

The multiplication output circuit 211-1 is coupled to the bit line BL through the first switch 201 of FIG. 2. As described above, the first switch 201 is omitted in FIG. 3.

The multiplication output circuit 211-1 includes a buffer 221 that buffers the bit line voltage VIwp1 and outputs the buffer output voltage Vbuf1 and a current source P1 that generates multiplication current I1 according to the buffer output voltage Vbuf1.

In this embodiment, the current source P1 is a PMOS transistor having a gate receiving the buffer output voltage Vbuf1, a source coupled to a power supply voltage VDD, and a drain outputting the multiplication current I1.

The current source P1 may further include a resistor R2 coupled between the power supply VDD and the source of the PMOS transistor of the current source P1.

A resistor R1 may be coupled between the input terminal of the buffer 221 and the power supply voltage VDD.

In this case, voltage of an input terminal of the buffer 221, that is, the bit line voltage VIwp1, corresponds to a voltage obtained by dividing the power supply voltage VDD by the ratio between resistance of the NAND string 310-1 and the resistance R1.

When the pulse input signal $PX_1$ is at the low level, the bit line selection switch N1 is turned off, so the bit line voltage VIwp1 is pulled up to the power supply voltage VDD. At this time, the buffer output voltage Vbuf1 is at the high level, and the PMOS transistor of the current source P1 is turned off.

When the pulse input signal $PX_1$ is at the high level, the bit line selection switch N1 is turned on, so the bit line voltage VIwp1 becomes a voltage close to the power supply voltage VDD or a voltage close to the source line voltage, that is the ground voltage, depending on the program state of the flash cell F1.

For example, if the flash cell F1 is programmed to a high resistance state, that is a high threshold voltage and where $W_1$ corresponds to "0", the resistance of the NAND string 310-1 becomes a large value and the bit line voltage VIwp1 becomes a voltage close to the power supply voltage VDD and the buffer output voltage Vbuf1 becomes high.

If the flash cell F1 is programmed to a low resistance state, that is a low threshold voltage and where $W_1$ corresponds to "1", the resistance of the NAND string 310-1 becomes small and the bit line voltage VIwp1 becomes a voltage close to the ground voltage and the buffer output voltage Vbuf1 becomes low.

When the buffer output voltage Vbuf1 is at the high level, the PMOS transistor P1 is turned off so that the multiplication current I1 becomes zero.

When the buffer output voltage Vbuf1 is at the low level, the PMOS transistor P1 is turned on so that the multiplication current I1 becomes greater than zero.

The computation output circuit 210 further includes an accumulation capacitor 212 and a reset switch 213.

The accumulation capacitor 212 is charged according to a sum of a plurality of multiplication currents I1, I2, . . . , In to output the computation voltage VMAC.

The reset switch 213 discharges the accumulation capacitor 212 according to the reset signal RESET.

Figure 6:
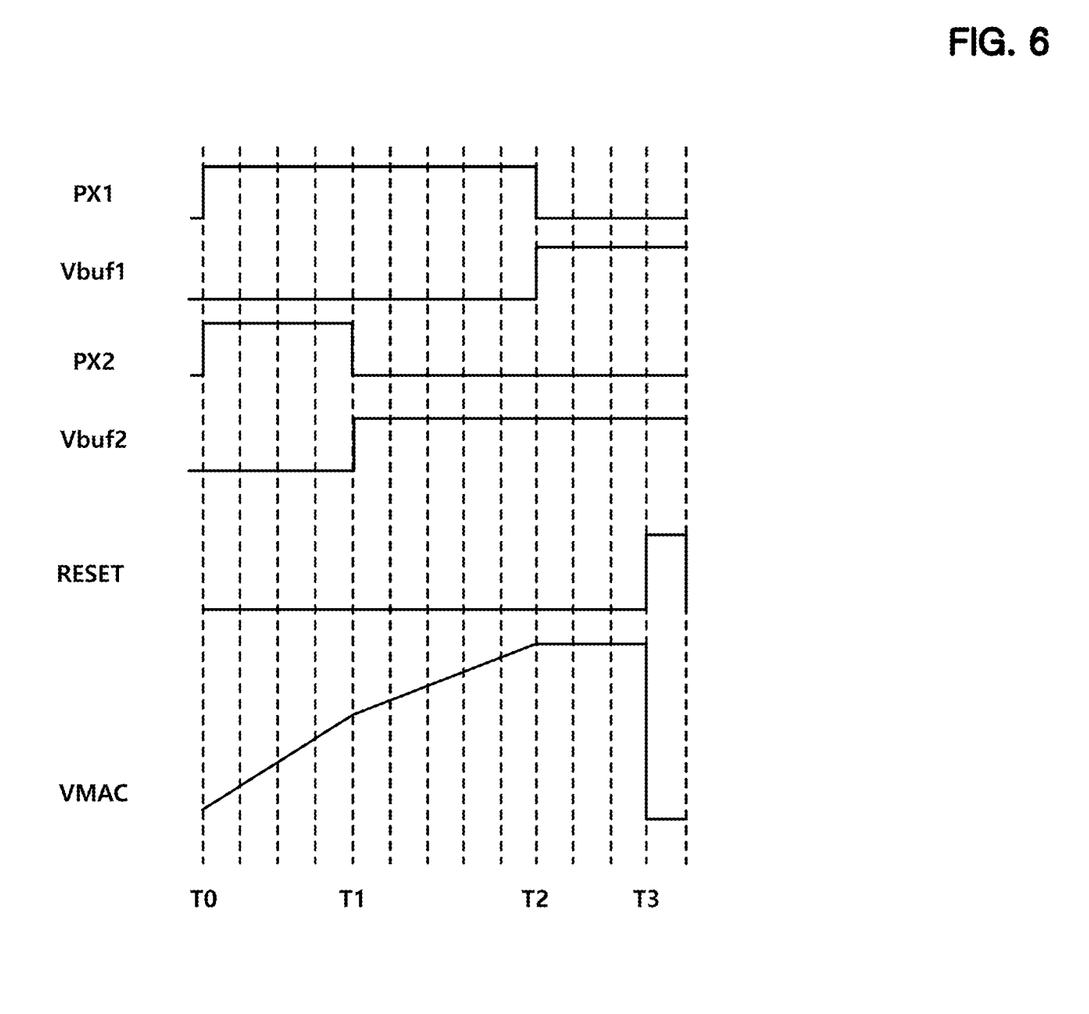
FIG. 6 illustrates a computation operation of a flash memory device according to an embodiment of the present disclosure.

FIG. 6 is a timing diagram illustrating a computation operation of a flash memory device according to an embodiment of the present disclosure.

In FIG. 6, it is assumed that the weight $W_1$ corresponding to the pulse input signal $PX_1$ and the weight $W_2$ corresponding to the pulse input signal PX2 are both "1". Furthermore, it is assumed that the other weights $W_3$ . . . $W_n$ are "0." Accordingly, the multiplication output circuit 211-3 . . . 211-$n$ produce no multiplication currents, regardless of the values of the pulse input signals $PX_3$ . . . $PX_n$, and are therefore not shown in FIG. 6.

In FIG. 6, the pulse input signal $PX_1$ has the high level between a zero-th time T0 and a second time T2 and thus the buffer output voltage Vbuf1 has the low level between times T0 and T2.

Accordingly, the multiplication current I1 is provided between times T0 and T2 to charge the accumulation capacitor 212.

In addition, the pulse input signal $PX_2$ has the high level between the zero-th time T0 and a first time T1 and thus the buffer output voltage Vbuf2 has the low level between times T0 and T1.

Accordingly, the multiplication current I2 is provided between times T0 and T1 to charge the accumulation capacitor 212.

The computation voltage VMAC increases rapidly, according to the sum of the multiplication current I1 and the multiplication current I2, between times T0 and T1 where the multiplication currents I1 and I2 are provided and then increases more slowly (according to the multiplication current I1, since the multiplication current I2 is zero during this period) between times T1 and T2.

At a third time T3, the reset signal RESET is activated to discharge the accumulation capacitor 212. An interval between T0 and T3 may correspond to a computation period.

The computation voltage VMAC immediately before the third time T3 corresponds to the inner product between the input vector having the input signals $X_1, X_2, \ldots, X_n$ as elements and the weight vector having the weight signals $W_1, W_2, \ldots, W_n$ as elements.

FIG. 3 assumes that weight of the first flash cell of each NAND string is programmed.

In another embodiment, weights may be programmed in other flash cells of each NAND string, in which case the flash cell array may store the entire weights included in a weight matrix.

In this case, the multiplication operation of the weight matrix and the input vector may be derived by performing the aforementioned operation for each row of the flash cell array.

The computation output circuit 210 may further include an analog-to-digital converter for converting the computation voltage VMAC into a digital signal.

The computation output circuit 210 may further include a circuit for adjusting the level of the computation voltage VMAC.

Figure 7A:
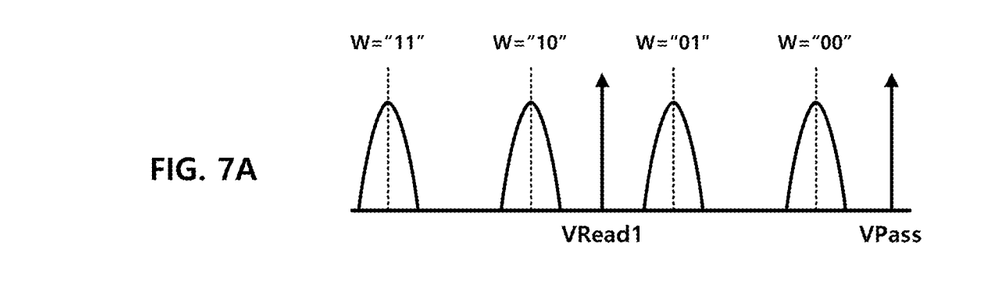
FIGS. 7A, 7B, and 7C and FIGS. 8A, 8B, and 8C illustrate a computation operation of a 2-bit flash memory device according to an embodiment of the present disclosure.
Figure 7B:
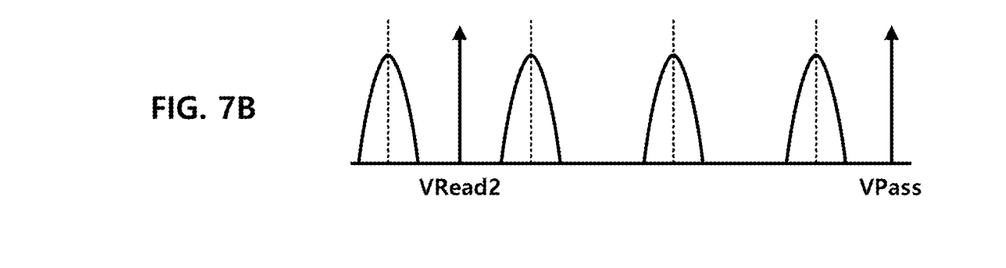
Figure 7C:
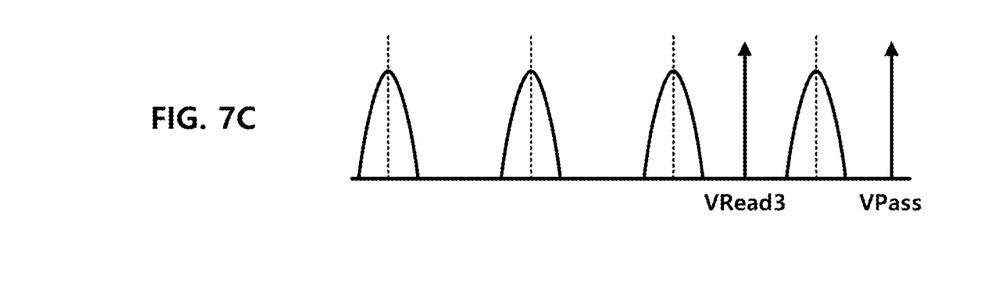
Figure 8A:
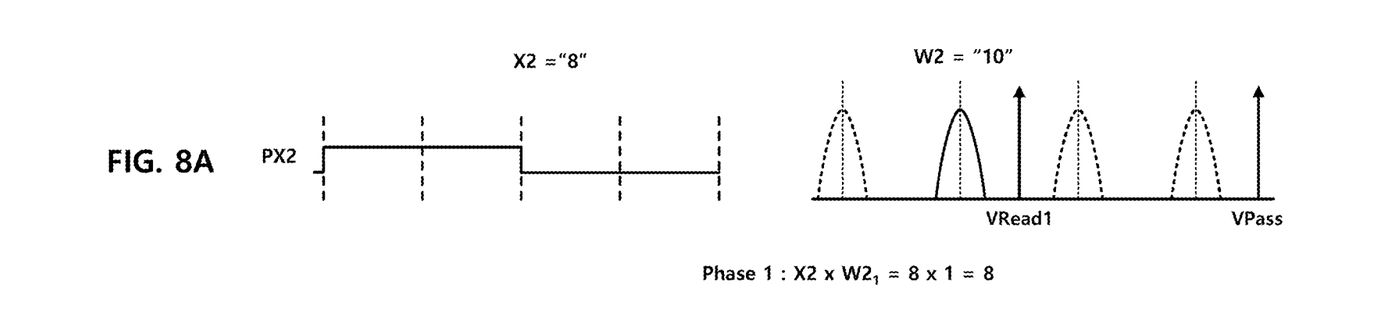
Figure 8B:
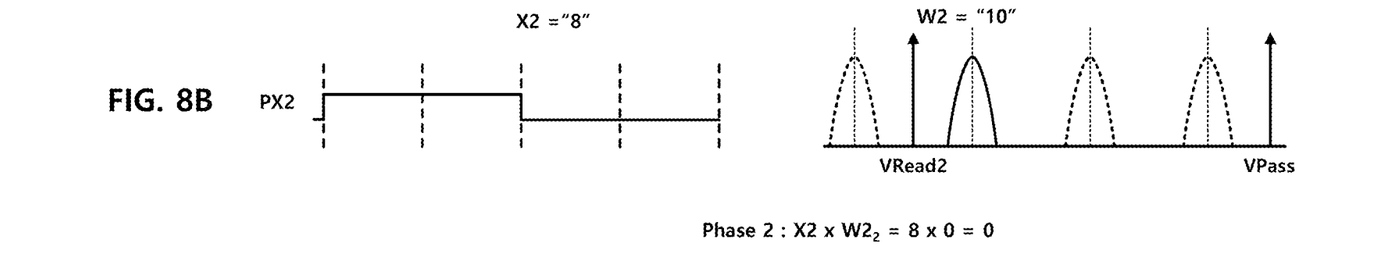
Figure 8C:
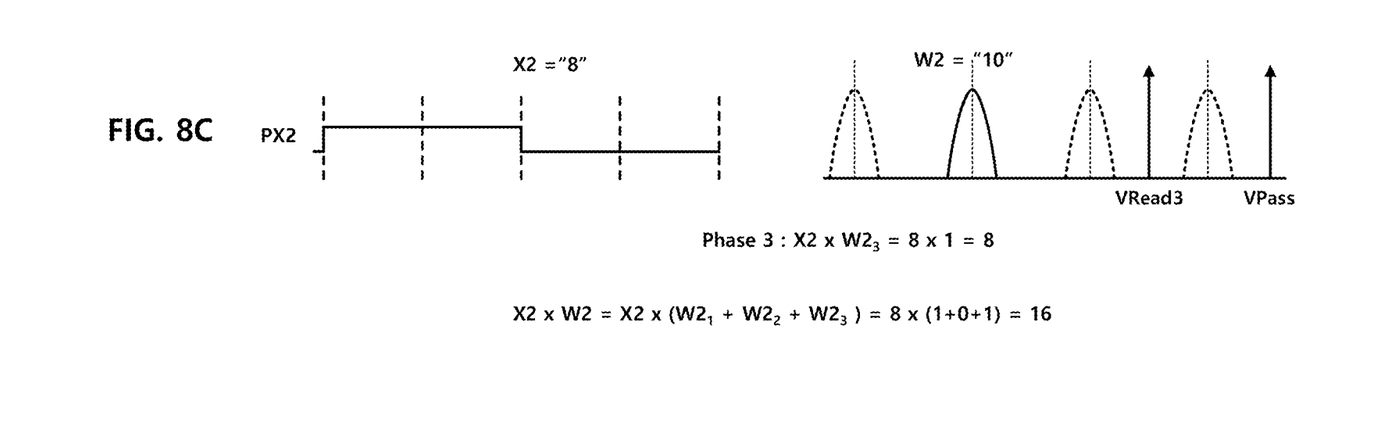

FIGS. 7 and 8 illustrate a computation operation when each weight is a 2-bit data.

Since a weight is a 2-bit data, the weight may be in one of four states including "00", "01", "10", and "11".

When each weight is a 2-bit data in an embodiment, the computation operation shown in FIG. 6 is repeated three times to generate final computation voltage.

That is, when each weight is a 2-bit data, the reset signal is activated after a computation period shown in FIG. 6 has elapsed three times.

A computation operation performed during one computation period may be referred as a computation step.

FIGS. 7A to 7C correspond to three computation steps respectively. During each computation step, a level of the read voltage is adjusted.

In a first computation step shown in FIG. 7A, the read voltage is set to the first voltage VRead1 that can distinguish "10" and "01". That is, when the first voltage VRead1 is provided to a cell during a read operation, the cell will turn on if it has a value of "10" or "11", and will not turn on if it has a value of "00" or "01".

In the second computation step shown in FIG. 7B, the read voltage is set to the second voltage VRead2 which can distinguish "11" and "10". That is, when the second voltage VRead2 is provided to a cell during a read operation, the cell will turn on if it has a value of "11", and will not turn on if it has a value of "00", "01", or "10".

In the third computation step shown in FIG. 7C, the read voltage is set to the third voltage VRead3 that can distinguish "01" and "00". That is, when the third voltage VRead3 is provided to a cell during a read operation, the cell will turn on if it has a value of "01", "10", or "11", and will not turn on if it has a value of "00".

FIGS. 8A to 8C show a process of multiplication of X2 and W2.

PX2 is represented as a pulse having a width of 8T because X2 is 8 as shown in FIG. 5, and PX2 remains the same in form through the first to third computation steps.

In FIGS. 8A to 8C, it is assumed that the weight W2 is "10".

Since the read voltage is set to the first voltage VRead1 in the first computation step, the weight is recognized as 1 during the first computation step.

Since the read voltage is set to the second voltage VRead2 in the second computation step, the weight is recognized as 0 during the second computation step.

Since the read voltage is set to the third voltage VRead3 in the third computation step, the weight is recognized as 1 during the third computation step.

Since the final computation voltage corresponds to the result of adding computation voltages generated while performing the first to third computation steps, the weight W2 is finally recognized as "10".

In FIGS. 8A to 8C, only the product of X2 and W2 is illustrated, but similar operations may be simultaneously performed for all of X1 to Xn and W1 to Wn, and finally a MAC operation result may be generated.

For weights of 3 bits or more, computation operation may be performed similarly like the above except a number of computation steps performed in a computation operation may be increased.

If the number of bits of a weight is K, final computation voltage may be obtained after performing a total of $2^K-1$ computation steps. In each computation step, the read voltage is set differently so that two adjacent weights can be distinguished.

Since computation operations can be easily derived by those skilled in the art from the foregoing description, a detailed disclosure will not be repeated.

Although various embodiments have been described for illustrative purposes, it will be apparent to those skilled in the art that various changes and modifications may be made to the described embodiments without departing from the spirit and scope of the disclosure as defined by the following claims.

What is claimed is:

1. A nonvolatile memory device comprising:
   a memory cell array including:
      a plurality of nonvolatile memory elements configured to store a plurality of weights respectively, and
      a plurality of bit lines coupled to the plurality of nonvolatile memory elements according to a plurality of input signals;
   a computation output circuit configured to generate a computation signal from voltages respectively induced at the plurality of bit lines according to the plurality of input signals; and
   an input circuit configured to convert the plurality of input signals into a plurality of pulse input signals,
   wherein the memory cell array comprises:
      a plurality of cell strings each including one of the plurality of nonvolatile memory elements, and
      a plurality of bit line selection switches coupling the plurality of cell strings to the plurality of bit lines according to the plurality of input signals;

wherein the plurality of bit line selection switches couples the plurality of cell strings with the plurality of bit lines according to the plurality of pulse input signals; and wherein the plurality of pulse input signals are pulse signals having widths respectively corresponding to respective values of the input signals.

2. The nonvolatile memory device of claim 1, wherein the memory cell array further includes a plurality of word lines, and wherein each of the plurality of cell strings includes a plurality of memory cells coupled in series, each memory cell in each cell string including a gate receiving a respective word line signal through a respective word line of the plurality of word lines.

3. The nonvolatile memory device of claim 1, wherein the memory cell array further includes:

a source line, and a plurality of source line selection switches coupling the plurality of cell strings to the source line according to a plurality of source line selection signals, respectively.

4. A nonvolatile memory device comprising:

a memory cell array including:

a plurality of nonvolatile memory elements configured to store a plurality of weights respectively, and a plurality of bit lines coupled to the plurality of nonvolatile memory elements according to a plurality of input signals; and a computation output circuit configured to generate a computation signal from voltages respectively induced at the plurality of bit lines according to the plurality of input signals, wherein the computation output circuit includes a plurality of multiplication output circuits, and wherein each of the plurality of multiplication output circuits generates a respective multiplication current corresponding to a product between a corresponding one of the plurality of input signals and a corresponding one of the plurality of weights.

5. The nonvolatile memory device of claim 4, wherein a multiplication output circuit of the plurality of multiplication output circuits includes a current source configured to generate the multiplication current of the multiplication output circuit according to a voltage of a corresponding one among the plurality of bit lines.

6. The nonvolatile memory device of claim 5, wherein the multiplication output circuit further includes:

a resistor coupling between a power source voltage and the corresponding one among the plurality of bit lines; and a buffer configured to buffer a voltage of a common node between the resistor and the corresponding one among the plurality of bit lines in order to generate a buffer output voltage.

7. The nonvolatile memory device of claim 6, wherein the current source is a p-channel Metal-Oxide-Semiconductor (PMOS) transistor including a gate receiving the buffer output voltage, a source coupled to the power source voltage, and a drain where the multiplication current of the multiplication output circuit is output.

8. The nonvolatile memory device of claim 7, wherein the current source further comprises a resistor coupled between the power source voltage and the source of the PMOS transistor.

9. The nonvolatile memory device of claim 4, wherein the computation output circuit further comprises an accumulation capacitor charged by the multiplication currents from the plurality of multiplication output circuits.

10. The nonvolatile memory device of claim 9, wherein the computation output circuit further comprises a reset switch to discharge the accumulation capacitor according to a reset signal.

11. The nonvolatile memory device of claim 1, wherein the nonvolatile memory device is a NAND flash memory device.

12. The nonvolatile memory device of claim 4, wherein each of the plurality of weights is a K-bit data and each of the plurality of multiplication output circuits performs 2K−1 computation steps to generate the respective multiplication current, wherein K is a natural number, and wherein a read voltage provided to one of the plurality of nonvolatile memory elements is set different in each computation step.

* * * * *